(12) United States Patent
Xie et al.

(10) Patent No.: US 11,004,750 B2
(45) Date of Patent: May 11, 2021

(54) MIDDLE OF THE LINE CONTACT FORMATION

(71) Applicant: International Business Machines Corporation, Armonk, NY (US)

(72) Inventors: Ruilong Xie, Niskayuna, NY (US); Chanro Park, Clifton Park, NY (US); Balasubramanian Pranatharthiharan, Watervliet, NY (US); Nicolas Loubet, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 39 days.

(21) Appl. No.: 16/572,005

(22) Filed: Sep. 16, 2019

(65) Prior Publication Data

US 2021/0082770 A1    Mar. 18, 2021

(51) Int. Cl.

| | |
|---|---|
| *H01L 21/8234* | (2006.01) |
| *H01L 29/66* | (2006.01) |
| *H01L 21/768* | (2006.01) |
| *H01L 21/3205* | (2006.01) |
| *H01L 21/311* | (2006.01) |
| *H01L 21/02* | (2006.01) |
| H01L 29/04 | (2006.01) |
| H01L 29/08 | (2006.01) |

(Continued)

(52) U.S. Cl.
CPC .. *H01L 21/823475* (2013.01); *H01L 21/0217* (2013.01); *H01L 21/02164* (2013.01); *H01L 21/31116* (2013.01); *H01L 21/32051* (2013.01); *H01L 21/76802* (2013.01); *H01L 21/76879* (2013.01); *H01L 21/823431* (2013.01); *H01L 21/823437* (2013.01); *H01L 21/823468* (2013.01); *H01L 29/6653* (2013.01); *H01L 21/823418* (2013.01); *H01L 29/045* (2013.01); *H01L 29/0847* (2013.01); *H01L 29/167* (2013.01); *H01L 29/36* (2013.01)

(58) Field of Classification Search
CPC ..... H01L 21/823431; H01L 21/823475; H01L 21/823418; H01L 21/823468; H01L 21/823437; H01L 29/6653; H01L 29/66795; H01L 29/41791; H01L 21/76897; H01L 21/76879
See application file for complete search history.

(56) References Cited

U.S. PATENT DOCUMENTS

| | | |
|---|---|---|
| 9,397,049 B1 | 7/2016 | Fan et al. |
| 9,461,143 B2 | 10/2016 | Pethe et al. |
| 9,780,178 B2 | 10/2017 | Xie et al. |

(Continued)

*Primary Examiner* — Michael M Trinh
(74) *Attorney, Agent, or Firm* — Douglas Pearson; Ryan, Mason & Lewis, LLP

(57) ABSTRACT

Methods for forming semiconductor devices are disclosed including forming a semiconductor structure having a semiconductor substrate containing two or more fins. The method includes etching a first optical planarization layer on the semiconductor structure exposing a top surface of each of a gate spacer, a gate cap layer and a portion of a source/drain contact adjacent to the exposed gate spacer to form a first gate contact opening. The method further includes depositing a sacrificial place-holder material in the first gate contact opening. The method further includes removing the first optical planarization layer. The method further includes recessing a first conductive material.

20 Claims, 12 Drawing Sheets

(51) Int. Cl.
  *H01L 29/167* (2006.01)
  *H01L 29/36* (2006.01)

(56) References Cited

U.S. PATENT DOCUMENTS

| | | |
|---|---|---|
| 9,905,671 B2* | 2/2018 | Cheng ................. H01L 29/6653 |
| 9,929,048 B1 | 3/2018 | Xie et al. |
| 9,941,162 B1 | 4/2018 | Chanemougame et al. |
| 9,941,278 B2* | 4/2018 | Labonte .............. H01L 23/5226 |
| 9,947,657 B2* | 4/2018 | Chen ................. H01L 29/66795 |
| 10,243,053 B1 | 3/2019 | Xie et al. |
| 10,249,728 B2 | 4/2019 | Chanemougame et al. |
| 10,832,964 B1* | 11/2020 | Xie ..................... H01L 29/0847 |
| 2016/0133623 A1* | 5/2016 | Xie .................. H01L 29/66545 |
| | | 257/384 |
| 2017/0012126 A1 | 1/2017 | Chu-Kung et al. |
| 2017/0053997 A1 | 2/2017 | Cheng et al. |
| 2017/0162581 A1* | 6/2017 | Lai .................... H01L 21/76897 |
| 2018/0130889 A1* | 5/2018 | Xie .................... H01L 21/0332 |

* cited by examiner

MIDDLE OF THE LINE CONTACT FORMATION

BACKGROUND

With the current trends in integrated circuit (IC) miniaturization, and increasingly smaller critical dimensions, it is desirable in semiconductor device technology to integrate many different functions on a single chip. In the IC chip fabrication industry, there are three sections referred to in a typical IC chip build: front end of the line (FEOL), back end of the line (BEOL), and the section that connects those two together, the middle of the line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices.

The FEOL transistor devices are typically processed using single crystal and poly-crystalline silicon. The BEOL interconnects are typically made of multiple metals; the bulk of the conductor is copper. If copper diffuses into the FEOL silicon-based devices, it can cause shorting or alter sensitive transistor characteristics and render the semiconductor useless. This is the reason for the MOL connection. BEOL generally begins when the first layer of metal is deposited on the wafer. BEOL includes contacts, insulating layers (dielectrics), metal levels, and bonding sites for chip-to-package connections.

Additionally, methods of forming IC structures have been developed that enable the formation of field effect transistors (FETs) with a gate contact over an active region to allow for area scaling. More specifically, MOL contacts are contacts that connect FETs to the BEOL metal levels. These MOL contacts include at least one gate contact and source/drain contacts. The gate contact extends vertically through the interlayer dielectric (ILD) material from a metal wire or via in the first BEOL metal level (referred to herein as the Mo level) to the gate of the FET. Each source/drain contact extends vertically through the ILD material from a metal wire or via in the first BEOL metal level to a metal plug, which is above and immediately adjacent to a source/drain region of the FET.

SUMMARY

Embodiments described herein provide methods of forming semiconductor devices.

For example, one exemplary embodiment includes a method for fabricating a semiconductor device. The method comprises forming a semiconductor structure comprising a semiconductor substrate having two or more fins. The semiconductor structure further comprises a plurality of recessed gate structures disposed on at least a portion of each of the fins. The semiconductor structure further comprises a gate cap layer disposed on a top surface of the recessed gate structures. The semiconductor structure further comprises gate spacers disposed on sidewalls of the recessed gate structures and the gate cap layer. The semiconductor structure further comprises a source/drain region in a recessed region of the semiconductor substrate between each adjacent gate spacer. The semiconductor structure further comprises a first conductive material disposed on a top surface of each of the source/drain regions and over a top surface of the recessed gate structures. The semiconductor structure further comprises a first optical planarization layer disposed over a top surface of the semiconductor structure. The method further comprises etching the first optical planarization layer on one of the fins and exposing a top surface of each of the gate spacers, the gate cap layer and a portion of the first conductive material adjacent to the exposed gate spacers to form a first gate contact opening. The method further comprises depositing a sacrificial place-holder material in the first gate contact opening. The method further comprises removing the first optical planarization layer. The method further comprises recessing the first conductive material.

Another exemplary embodiment includes a method for fabricating a semiconductor device. The method comprises forming a semiconductor structure comprising a semiconductor substrate having two or more fins. The semiconductor structure further comprises a plurality of recessed gate structures disposed on at least a portion of each of the fins. The semiconductor structure further comprises a gate cap layer disposed on a top surface of the recessed gate structures. The semiconductor structure further comprises gate spacers disposed on sidewalls of the recessed gate structures and the gate cap layer. The semiconductor structure further comprises a source/drain region in a recessed region of the semiconductor substrate between each adjacent gate spacer. The semiconductor structure further comprises a first conductive material disposed on a top surface of each of the source/drain regions and over a top surface of the recessed gate structures. The semiconductor structure further comprises a first optical planarization layer disposed over a top surface of the semiconductor structure. The method further comprises etching the first optical planarization layer on one of the fins and exposing a top surface of each of the gate spacers, the gate cap layer and a portion of the first conductive material adjacent to the exposed gate spacers to form a first gate contact opening. The method further comprises depositing a liner layer in the first gate contact opening. The method further comprises depositing a sacrificial place-holder material on the liner layer and filling the first gate contact opening. The method further comprises removing the first optical planarization layer. The method further comprises recessing the first conductive material.

Another exemplary embodiment includes a method for fabricating a semiconductor device. The method comprises forming a semiconductor structure comprising a semiconductor substrate having two or more fins. The semiconductor structure further comprises a plurality of recessed gate structures disposed on at least a portion of each of the fins. The semiconductor structure further comprises a gate cap layer disposed on a top surface of each of the gate structures. The semiconductor structure further comprises gate spacers disposed on sidewalls of each of the gate structures and the gate cap layer. The semiconductor structure further comprises a source/drain region in a recessed region of the semiconductor substrate between each adjacent gate spacer. The semiconductor structure further comprises a first interlevel dielectric layer disposed on a top surface of each of the source/drain regions. The semiconductor structure further comprises a first optical planarization layer disposed over a top surface of the semiconductor structure. The method further comprises selectively etching the first optical planarization layer on one of the fins and removing the first interlevel dielectric layer and a portion of each of the gate spacers to form a first opening. The upper portion of the gate spacers has a tapered shape. The method further comprises removing the first optical planarization layer. The method further comprises depositing a first conductive material in the first opening. The method further comprises recessing the first conductive material to a bottom portion of the tapered shape of the gate spacer to form a second opening. The method further comprises depositing a cap layer in the second opening. The method further comprises depositing a second optical planarization layer on a top surface of the semiconductor structure. The method further comprises forming third opening in the second optical planarization layer exposing at least a top surface of the cap layer. The method further comprises depositing a sacrificial placeholder material in the third opening. The method further comprises removing the second optical planarization layer. The method further comprises recessing the gate structures.

Another exemplary embodiment includes a semiconductor structure which comprises a semiconductor substrate having two or more fins. The semiconductor structure further comprises a plurality of recessed gate structures having opposing sidewalls, the recessed gate structure located over at least one of the fins. The semiconductor structure further comprises a gate cap layer disposed on a top surface of the recessed gate structures. The semiconductor structure further comprises a gate spacer disposed on the opposing sidewalls of the recessed gate structures and the gate cap layer. The semiconductor structure further comprises a source/drain region disposed between adjacent gate spacers. The semiconductor structure further comprises a first conductive material disposed on the source/drain region. The semiconductor structure further comprises a metal layer disposed on a top surface of the first conductive material and below a top surface of the gate spacer. The semiconductor structure further comprises an interlevel dielectric layer disposed on a top surface of the metal layer, gate spacer and gate cap layer and defining a self-aligned gate contact opening exposing a top surface of one of the recessed gate structures and the gate spacer. The semiconductor structure further comprises a second conductive material disposed in the self-aligned gate contact opening.

These and other features, objects and advantages of the present invention will become apparent from the following detailed description of illustrative embodiments thereof, which is to be read in connection with the accompanying drawings.

DETAILED DESCRIPTION

Figure 1A:
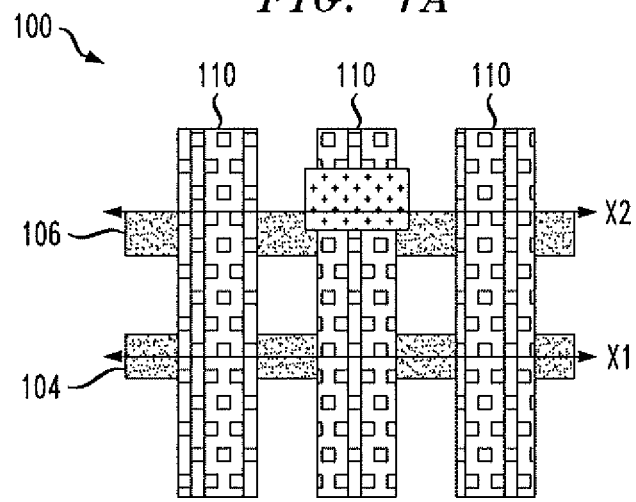
FIG. 1A is a top view of a semiconductor structure showing the X1 axis and the X2 axis, according to an illustrative embodiment.
Figure 1B:
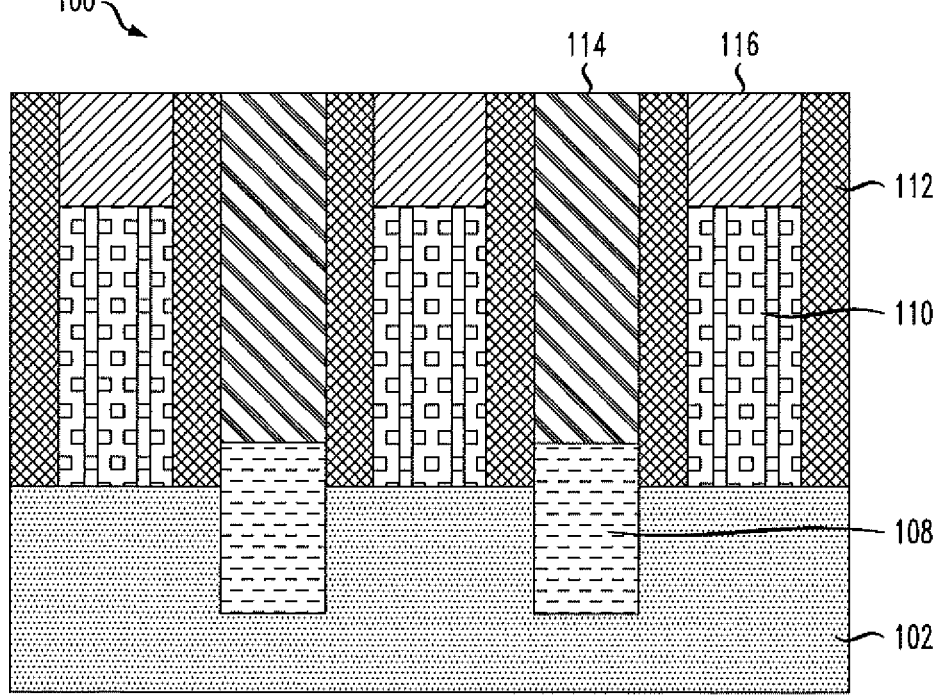
FIG. 1B is a cross sectional view of a semiconductor structure taken along the X2 axis of FIG. 1A at a first-intermediate fabrication stage, according to an illustrative embodiment.

The present application generally relates to transistors, and more particularly to semiconductor devices and methods for their fabrication.

Conventional techniques for forming these MOL contacts inherently include risks of the following: (a) shorts occurring between the gate contact and a metal plug, particularly, if the gate contact is over an active region or close thereto;

and (b) shorts occurring between the source/drain contacts and the gate. However, new techniques have been developed that provide for the formation of these MOL contacts without incurring the above-mentioned risks of shorts. Unfortunately, the techniques used to form a FET with a gate contact over an active region usually requires a thick gate dielectric cap to begin with, which is challenging to achieve as gate pitch and gate dimension scales.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

Illustrative embodiments for forming a semiconductor device will be described below with reference to FIGS. 1A-16B. Note that the same reference numeral (100) is used to denote the semiconductor structure through the various intermediate fabrication stages illustrated in FIGS. 1A through 16B. Note also that the semiconductor structure described herein can also be considered to be a semiconductor device and/or an integrated circuit, or some part thereof. For the purpose of clarity, some fabrication steps leading up to the production of the semiconductor structure as illustrated in FIGS. 1A-16B are omitted. In other words, one or more well-known processing steps which are not illustrated but are well-known to those of ordinary skill in the art have not been included in the figures.

FIGS. 1A-6B illustrate one embodiment of the present invention. FIG. 1A illustrates a top view of semiconductor structure 100 showing the X1 axis and the X2 axis after a plurality of fins 104 and 106 have been formed on a semiconductor substrate (not shown) with gate structures 110 and a gate. FIG. 1B is a cross sectional view of a semiconductor structure taken along the X2 axis of FIG. 1A at a first-intermediate fabrication stage. Semiconductor structure 100 is shown comprising semiconductor substrate 102 with a plurality of fins 104 and 106 (see FIG. 1A). In one embodiment, the semiconductor substrate 102 is comprised of, for example, silicon (Si). In another embodiment, the semiconductor substrate is comprised of a semiconductor material including, but not limited to, silicon, germanium, a silicon-germanium alloy, a silicon carbon alloy, a silicon-germanium-carbon alloy, gallium arsenide, indium arsenide, indium phosphide, group III-V compound semiconductor materials, group II-VI compound semiconductor materials, organic semiconductor materials, or other compound semiconductor materials. However, the semiconductor substrate may be comprised of any material suitable for use in accordance with the embodiments described herein.

Semiconductor structure 100 further includes source/drain regions 108 between adjacent gate structures 110 and in contact with the substrate 102 (or counter-doped layer if formed), wherein a channel region is located under the gate structure. The substrate 102 may be anisotropically recessed to form source/drain regions 108. Source/drain regions 108 are formed, for example, in the P-FET and N-FET regions, respectively, around the fin. However, source/drain regions 108 can be formed in only P-FET regions or N-FET regions around the fin. The source/drain regions 108 can be formed by bottom-up epitaxial growth processes during epitaxial growth. The source/drain regions 108 are grown in separate or simultaneous epitaxial processes from each other to a desired height (thickness) such as, for example, about 25 nm to about 80 nm.

The epitaxially grown source/drain regions 108 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc. Suitable dopants include, for example, an n-type dopant selected from a group of phosphorus (P), arsenic (As) and antimony (Sb), or a p-type dopant selected from a group of boron (B), gallium (Ga), indium (In), and thallium (Tl) at various concentrations. For example, in a non-limiting example, a dopant concentration range may be $1 \times 10^{18}/cm^3$ to $1 \times 10^{21}/cm^3$. According to an embodiment, the bottom source/drain regions 104a and 104b can include a boron doped SiGe, or a phosphorous doped silicon.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

Semiconductor structure 100 further includes gate structures 110. During a gate process, the gate electrode may include a polysilicon material that is subsequently removed (i.e., via an etch process) and replaced (i.e., via a deposition process) by materials that may include a high-k metal gate structure having, for example, a high-k dielectric layer that is formed over a region of the surface of the fin, a workfunction metal layer formed over the a high-k dielectric layer and a gate electrode formed over the workfunction metal layer (not shown). The high-k dielectric layer may include, for example, a high-k metal oxide based material such as, but not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, or $Y_2O_xN_y$. The workfunction metal layer may include, for example, a titanium nitride (TiN), TiAlC, TiAl, TiC, TaN, etc. A metal fill material may include, for example, aluminum (Al) or tungsten (W). Gate structures 110 are formed using a conventional deposition process including, for example, atomic layer deposition (ALD), molecular layer deposition (MLD), chemical vapor deposition (CVD), and physical vapor deposition (PVD), among other known processes.

Gate structures 110 further include gate spacers 112 on the sidewalls of the gate structure. The gate spacers 112 may be formed on the sidewalls of gate structures 110 by, for example, low pressure chemical vapor deposition (LPCVD) of a dielectric layer. The gate spacers 112 may protect the gate structures 110 (i.e., high-K metal gate structure) and electrically isolate the gate electrode from electrical crosstalk that may occur with any electrical contacts that are formed with respect to subsequently grown epitaxially source/drain regions 108 as discussed above. Suitable material for gate spacers 112 includes, for example, a dielectric material. For example, the dielectric materials used to form the gate spacers 108 may include silicon oxide, silicon nitride, silicon oxynitride, SiOCN, SiBCN, SiCO, etc.

Semiconductor structure 100 further includes an interlevel dielectric (ILD) layer 114 deposited in the openings between gate spacers 112 and on the top surface bottom source/drain regions 108. The ILD layer 114 includes, for example, any suitable dielectric material such as silicon oxide, silicon nitride, hydrogenated silicon carbon oxide, silicon based low-k dielectrics, flowable oxides, porous dielectrics, or organic dielectrics including porous organic dielectrics. Non-limiting examples of suitable low-k dielectric materials include a spin-on-glass, a flowable oxide, a high density plasma oxide, borophosphosilicate glass (BPSG), or any combination thereof. The ILD layer 114 may be formed using any suitable deposition techniques including CVD, ALD, PVD, plasma enhanced chemical vapor deposition (PECVD), chemical solution deposition or other like processes. ILD layer 114 is then planarized by, for example, a planarization process such as a chemical mechanical planarization (CMP).

Semiconductor structure 100 further includes a gap cap layer 116 deposited on the top surface of gate structures 110 after the gate structures 110 have been recessed to below a top surface of ILD layer 114. For example, gate cap layer 116 can be formed by depositing a layer of dielectric material (e.g., SiCO, SiC and SiN). Gate cap layer 116 is formed using a conventional deposition process including, for example, ALD, MLD, CVD, and PVD, among other known processes. In general, gate cap layer 116 can have a thickness ranging from about 10 nm to about 35 nm. In one embodiment, gate cap layer 116 can have a thickness ranging from about 10 nm to about 15 nm. In one embodiment, gate cap layer 116 can have a thickness ranging from about 20 nm to about 35 nm.

Figure 2:
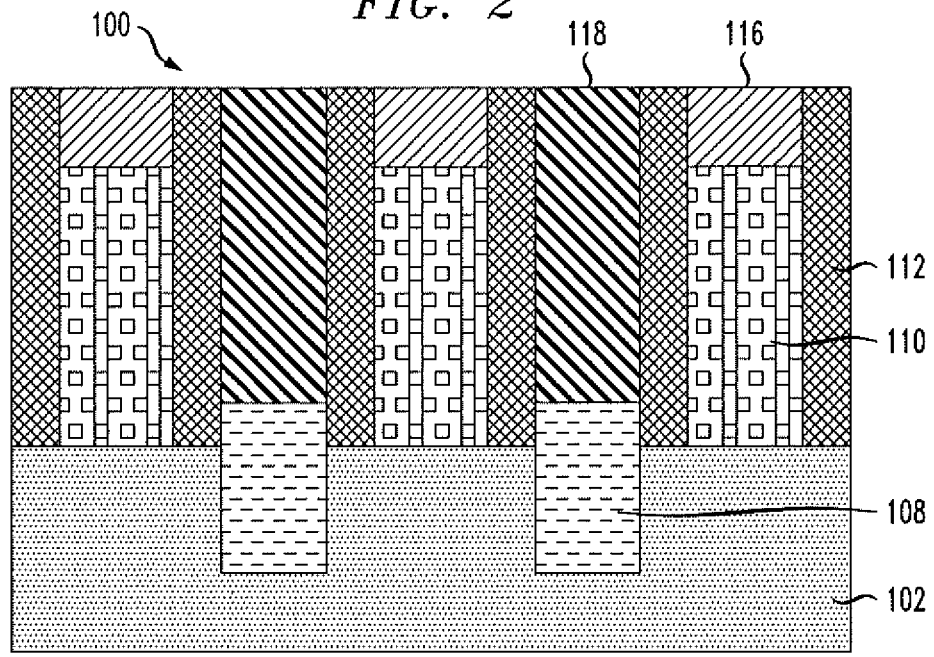
FIG. 2 is a cross sectional view of a semiconductor structure taken along the X2 axis of FIG. 1A at a second-intermediate fabrication stage, according to an illustrative embodiment.

FIG. 2 illustrates a cross-sectional view of semiconductor structure 100 taken along the X2 axis of FIG. 1A at a second-intermediate fabrication stage. During this stage, source/drain contact 118 is formed by methods known in the art, e.g., lithography patterning (patterning mask not shown, as it is removed after the etch is done) followed by etching, e.g., etching through the mask layer and ILD layer 114 and exposing the top surface of bottom source/drain regions 108 by, for example, reactive ion etching (ME). Accordingly, the resulting trench is communicative with the respective component, e.g., conductive trenches or vias communicative with the respective source/drain region 108.

Next, a metal material is deposited in the trench to form source/drain contact 118. If desired, a sidewall metal liner material (not shown) which forms silicide with source/drain regions 108, such as Ti silicide, Ni silicide, Co silicide, etc, can be disposed in the trench which improves reliability and adhesion of metal fill. Thus, for example, sidewall metal liner can include a thin TiN liner. The source/drain contact 118 further comprises the core metal fill material which provides low resistance for conducting current, such as W, Co, Ru, Mo, Cu, etc. The layer of metal material may further comprise dopants that are incorporated during or after deposition. The layer of conductive material is deposited using a suitable deposition process, for example, CVD, PECVD, PVD, plating, thermal or e-beam evaporation, sputtering, etc.

Figure 3:
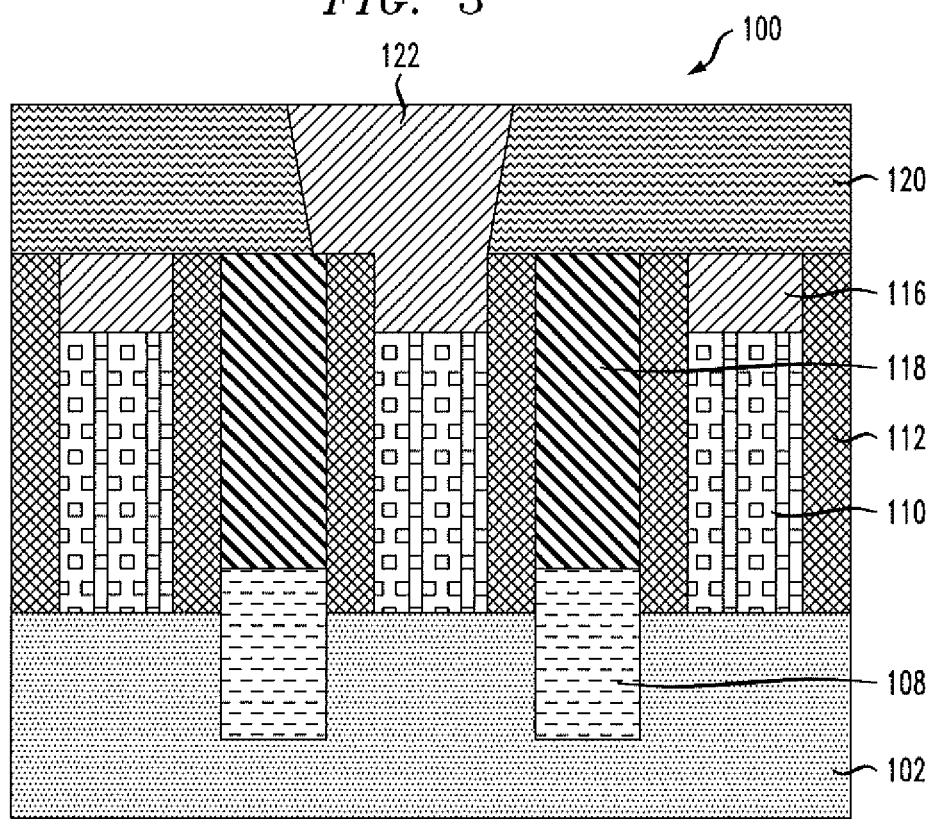
FIG. 3 is a cross sectional view of a semiconductor structure taken along the X2 axis of FIG. 1A at a third-intermediate fabrication stage, according to an illustrative embodiment.

FIG. 3 illustrates a cross-sectional view of semiconductor structure 100 taken along the X2 axis of FIG. 1A at a third-intermediate fabrication stage. During this stage, an optical planarization layer (OPL) 120 is deposited on the top surface of semiconductor structure 100 using traditional techniques for forming such materials, e.g., spin-coating, deposition, etc. Next, a gate contact opening is formed in the OPL 120 after selective etching the OPL 120 and exposing a portion of the top surface of one of source/drain contact 118 and the top surface of gate cap layer 116 and gate spacers 112 therebetween. Gate contact opening is formed using an etch process and etch environment which is suitable to etch the OPL 120.

Next, sacrificial place-holder material 122 is deposited in and fills the gate contact opening. Sacrificial place-holder material 122 can be deposited using a suitable deposition process, for example, CVD, PECVD, PVD, plating, thermal or e-beam evaporation, sputtering, etc. Suitable material for sacrificial place-holder material 122 includes, for example, SiC or SiCO. As one skilled in the art will understand, sacrificial place-holder material 122 is a material which can be similar or the same as gate cap 116, but different than gate spacers 112. After depositing the sacrificial place-holder material 122, an etching back process can be performed to remove any overburden sacrificial place-holder material and reveal the top surface of the OPL.

Figure 4:
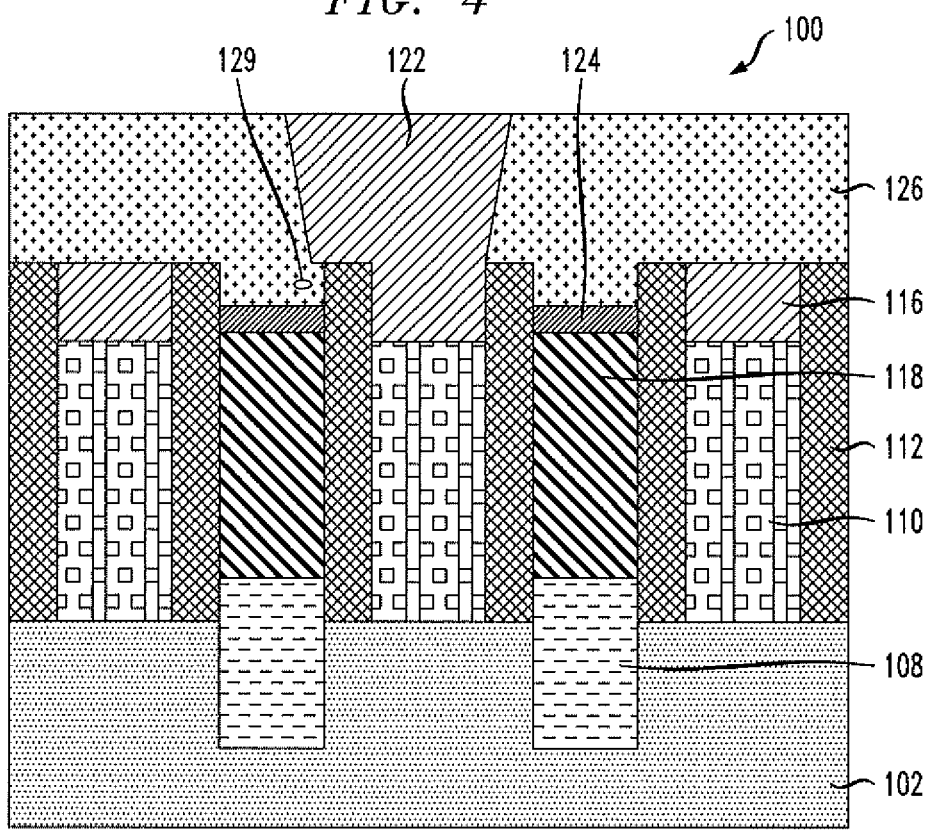
FIG. 4 is a cross sectional view of a semiconductor structure taken along the X2 axis of FIG. 1A at a fourth-intermediate fabrication stage, according to an illustrative embodiment.

FIG. 4 illustrates a cross-sectional view of semiconductor structure 100 taken along the X2 axis of FIG. 1A at a fourth-intermediate fabrication stage. During this stage, OPL 120 is first selectively removed using various etching processes such as, for example, a plasma ash etching process. OPL 120 is also removed from the top surface of semiconductor structure 100 when looking at a cross-sectional view of semiconductor structure 100 taken along the X1 axis of FIG. 1A (not shown). The plasma ash etching process is selective to OPL 120 and not the gate spacers 112, gate cap layer 116 and sacrificial place-holder material 122. Alternatively, a dry etching process, for example, RIE may be used. Source/drain contact 118 is then recessed to below the top surface of gate spacer 112 by carrying out an isotropic etching technique such as an atomic layer etching that is selective to source/drain contact 118, and not gate spacers 112, gate cap layer 116 and sacrificial place-holder material 122.

Next, a metal 124 is selectively grown in the recessed portion of source/drain contact 118 and below the top surface of gate spacers 112. A suitable metal is one that is different than source/drain contact 118 such as, for example, tungsten (W) when source/drain contact 118 is cobalt. Metal 124 can be grown by techniques known in the art. For example, metal 124 is selectively grown over the metal from top surface of the source/drain contact 118.

A dielectric layer 126 is then deposited on the top surface of metal 124 and over the semiconductor structure. Suitable dielectrics include, for example, $SiO_2$. Dielectric layer 126 is deposited by a suitable deposition process, including, but not limited to, CVD, PVD, PECVD, ALD, evaporation, chemical solution deposition, or like processes. Semiconductor structure 100 taken along the X1 axis of FIG. 1A will have oxide layer 126 disposed on its top surface (not shown). As can be seen, an airgap or seam 129 can be formed in dielectric layer 126 under the bottom surface of the opening extending beyond the gate spacers 112 depending on the deposition method.

Figure 5:
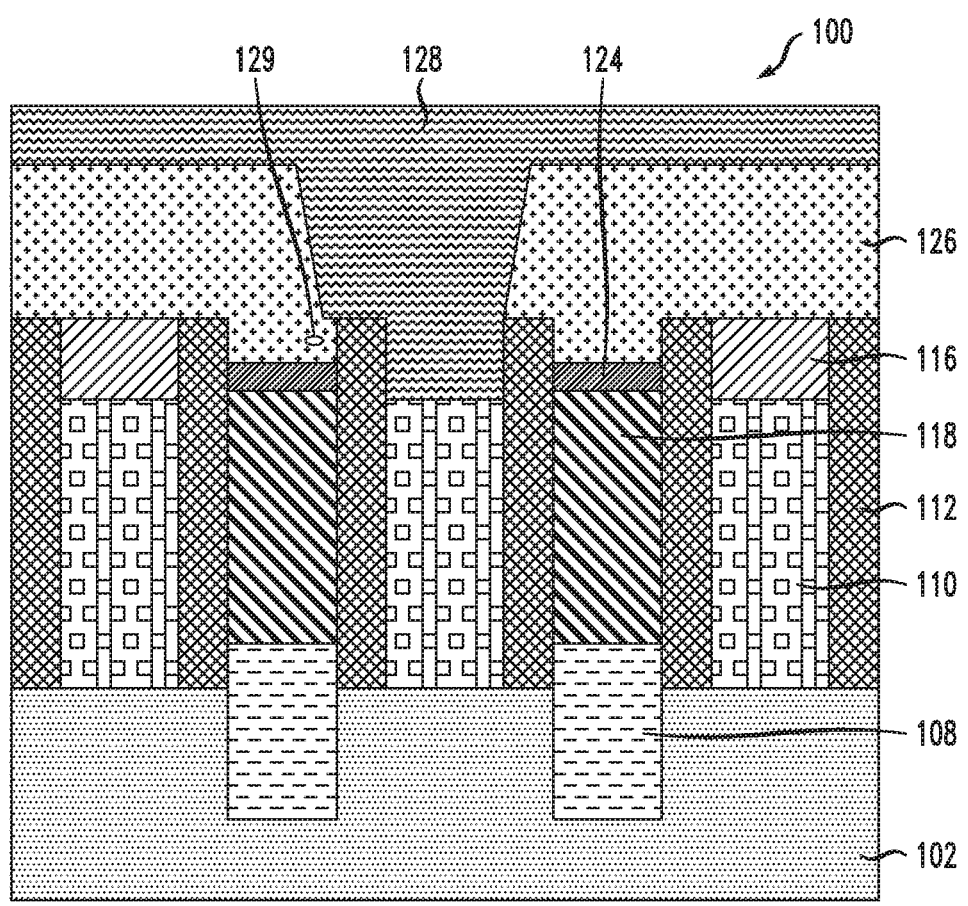
FIG. 5 is a cross sectional view of a semiconductor structure taken along the X2 axis of FIG. 1A at a fifth-intermediate fabrication stage, according to an illustrative embodiment.

FIG. 5 illustrates a cross-sectional view of semiconductor structure 100 taken along the X2 axis of FIG. 1A at a fifth-intermediate fabrication stage. During this stage, sacrificial place-holder material 122 and gate cap 116 thereunder is removed using a dry etching process which is selective to dielectric layer 126 and gate spacers 112, for example, RIE, to create a via and expose the top surfaces of gate structures 110 and gate spacers 112 disposed between gate structures 110 and source/drain contact 118. Next, OPL 128 is deposited in the via and over the top surface of oxide layer 126 using traditional techniques for forming such materials, e.g., spin-coating, deposition, etc. If desired, OPL 128 can be planarized by, for example, CMP. The deposition of OPL 128 is also patterned using standard lithography patterning followed by etching to create vias for forming source/drain contacts when looking at a cross-sectional view of semiconductor structure 100 taken along the X1 axis of FIG. 1A (not shown).

Figure 6A:
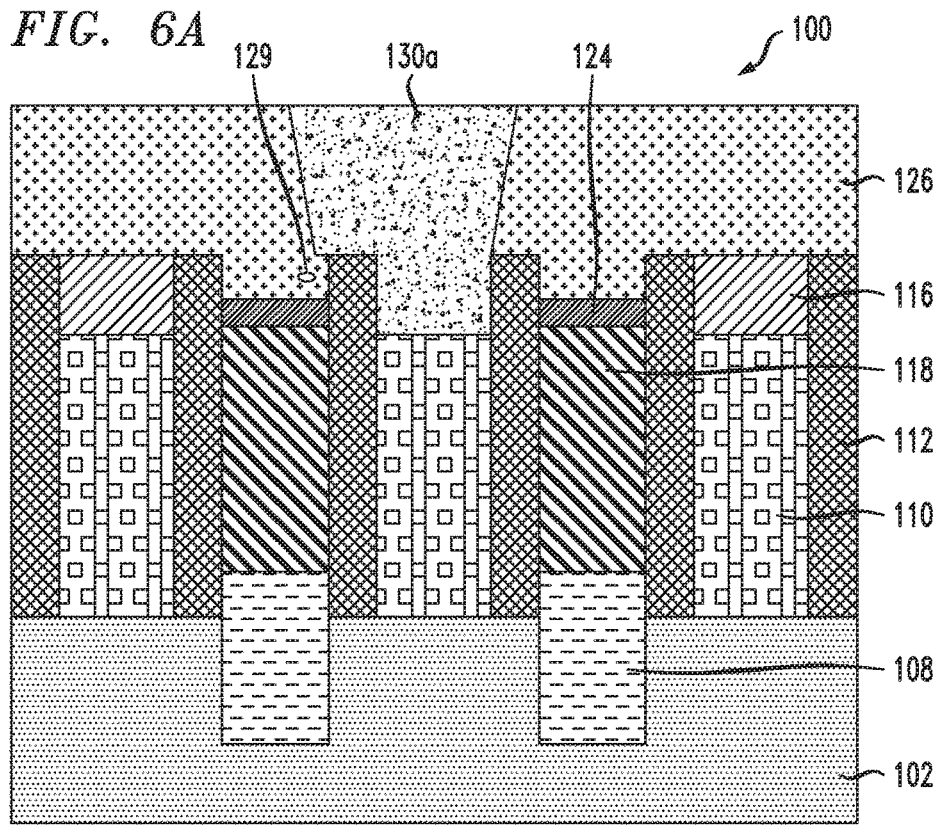
FIG. 6A is a cross sectional view of a resulting semiconductor structure taken along the X2 axis of FIG. 1A at a sixth-intermediate fabrication stage, according to an illustrative embodiment.

FIG. 6A illustrates a cross-sectional view of semiconductor structure 100 taken along the X2 axis of FIG. 1A at a sixth-intermediate fabrication stage where OPL 128 is selectively removed using various etching processes such as, for example, a plasma ash etching process, to form a via exposing the top surfaces of gate structures 110 and gate spacers 112 disposed between adjacent source/drain contacts 118, and a portion of oxide layer 126. The plasma ash etching process is selective to OPL 128 and not the gate structures 110, gate spacers 112 and oxide layer 126. Alternatively, a dry etching process, for example, RIE may be used. Next, a conductive material is then deposited within the opening and forming gate contact 130a by a suitable deposition process, including, but not limited, CVD, PECVD, PVD, plating, thermal or e-beam evaporation, sputtering, etc. The conductive material for forming gate contact 130a can be any of the material used to form source/drain contact 118 as discussed above. In one embodiment, the conductive material includes, for example, Al, W, Cu, Co. Ru, Mo, etc., with an optional suitable metal liner or other suitable types of conductive material.

Figure 6B:
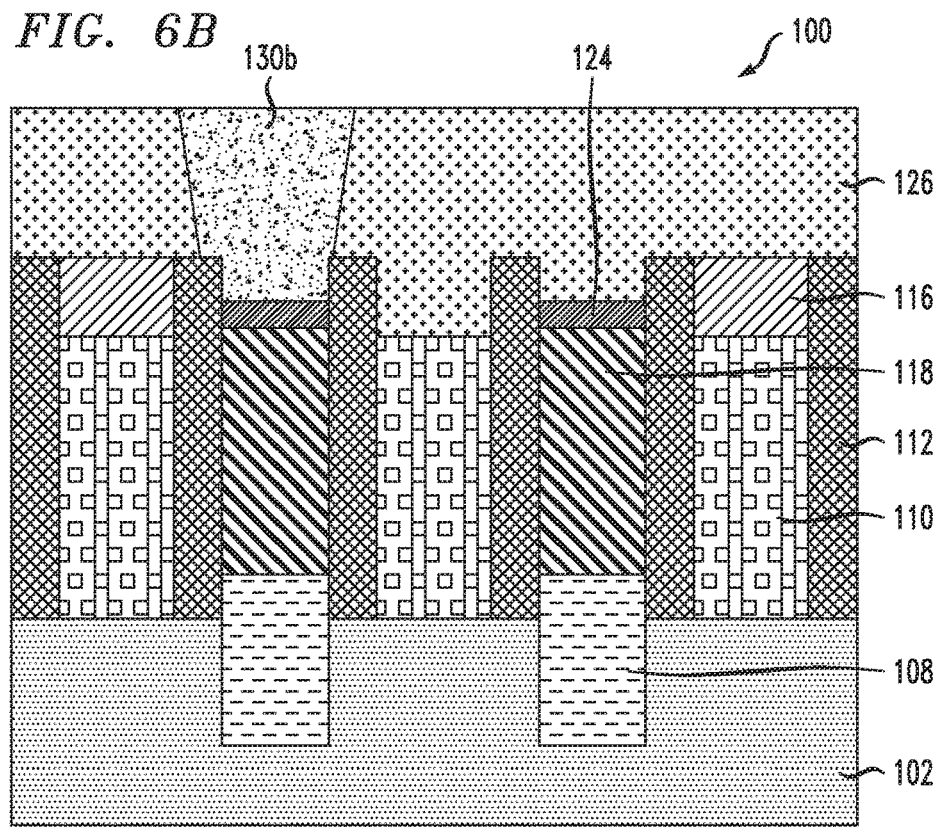
FIG. 6B is a cross sectional view of a resulting semiconductor structure taken along the X1 axis of FIG. 1A at the sixth-intermediate fabrication stage, according to an illustrative embodiment.

FIG. 6B illustrates a cross-sectional view of semiconductor structure 100 taken along the X1 axis of FIG. 1A at the sixth-intermediate fabrication stage where a conductive material is then deposited within the via and forming source/drain contact 130b by a suitable deposition process, including, but not limited, CVD, PECVD, PVD, plating, thermal or e-beam evaporation, sputtering, etc. The conductive material for forming source/drain contacts 130b can be any of the conductive material discussed above. In one embodiment, the conductive material includes, for example, Al, W, Cu, Co Ru, Mo, etc., with optional metal liner or other suitable types of conductive material.

Figure 7:
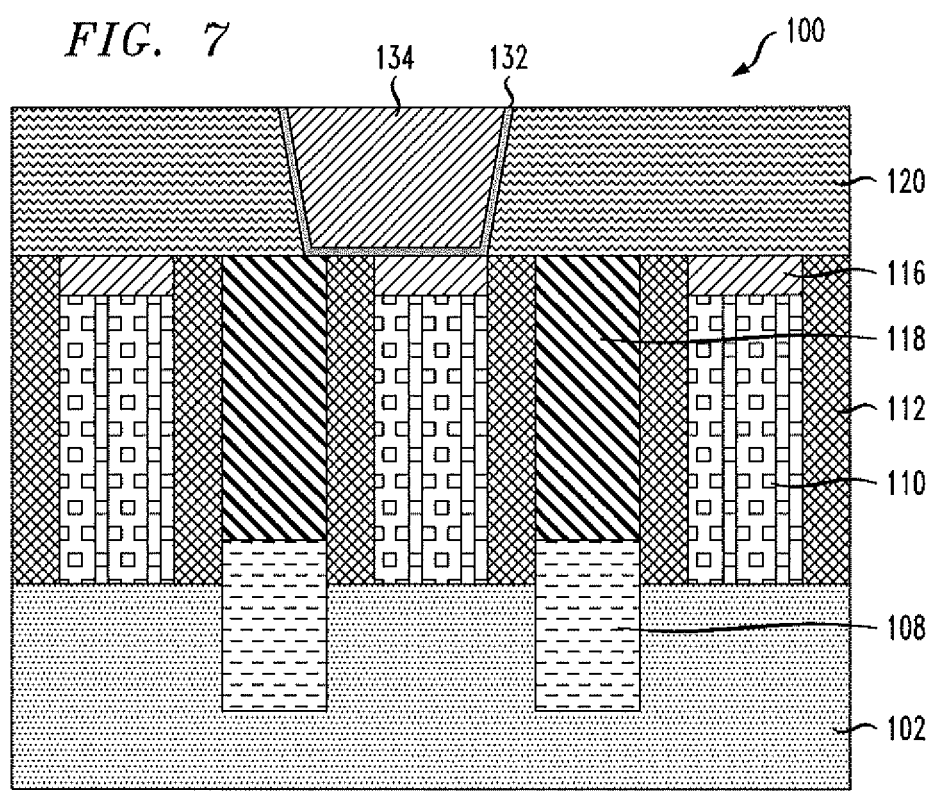
FIG. 7 is a cross sectional view of a semiconductor structure taken along the X2 axis of FIG. 1A at first-intermediate fabrication stage following the fabrication stage of FIG. 2, according to an alternative illustrative embodiment.

FIGS. 7-10B illustrate an alternate embodiment starting with the semiconductor structure 100 from FIG. 2. First, as shown in FIG. 7, semiconductor structure 100 is shown comprising semiconductor substrate 102. Semiconductor structure 100 further includes source/drain regions 108 between adjacent gate structures 110 and in contact with the substrate 102 (or counter-doped layer if formed), wherein a channel region is located under the gate structure. Semiconductor structure 100 further includes gate structures 110.

Gate structures 110 further include gate spacers 112 on the sidewalls of the gate structure. Semiconductor structure 100 further includes a source/drain contacts 118 deposited in the openings between gate spacers 112 and on the top surface bottom source/drain regions 108. The gate structures 110 are recessed and gate cap layer 116 is disposed thereon. In general, gate cap layer 116 can have a thickness ranging from about 10 nm to about 35 nm. In one embodiment, gate cap layer 116 can have a thickness ranging from about 10 nm to about 15 nm.

During this stage, one or more trenches are formed exposing the top surface of gate spacers 112 and gate cap layer 116 and a portion of source/drain contact adjacent to gate spacers 112 by techniques known in the art. For example, an OPL 120 can first be deposited on the top surface of semiconductor structure 100. Next, OPL 120 can be patterned and then etched by, for example, RIE, to form the trench. A liner layer 132 is then deposited in the trench using a conventional deposition process, for example, CVD, PECVD, PVD, plating, thermal or e-beam evaporation, sputtering, etc. Suitable material for liner layer includes, for example, $SiO_2$, $HfO_2$, AlOx, etc.

A capping layer 134 is deposited on liner layer 132 to fill the trench and then planarized by, for example, CMP. The capping layer 134 comprises, for example, a nitride material such as SiN or other materials such as SiC, SiCO, $SiO_2$, etc. The capping layer 134 can be deposited using a suitable deposition process, for example, CVD, PECVD, PVD, plating, thermal or e-beam evaporation, sputtering, etc.

Figure 8:
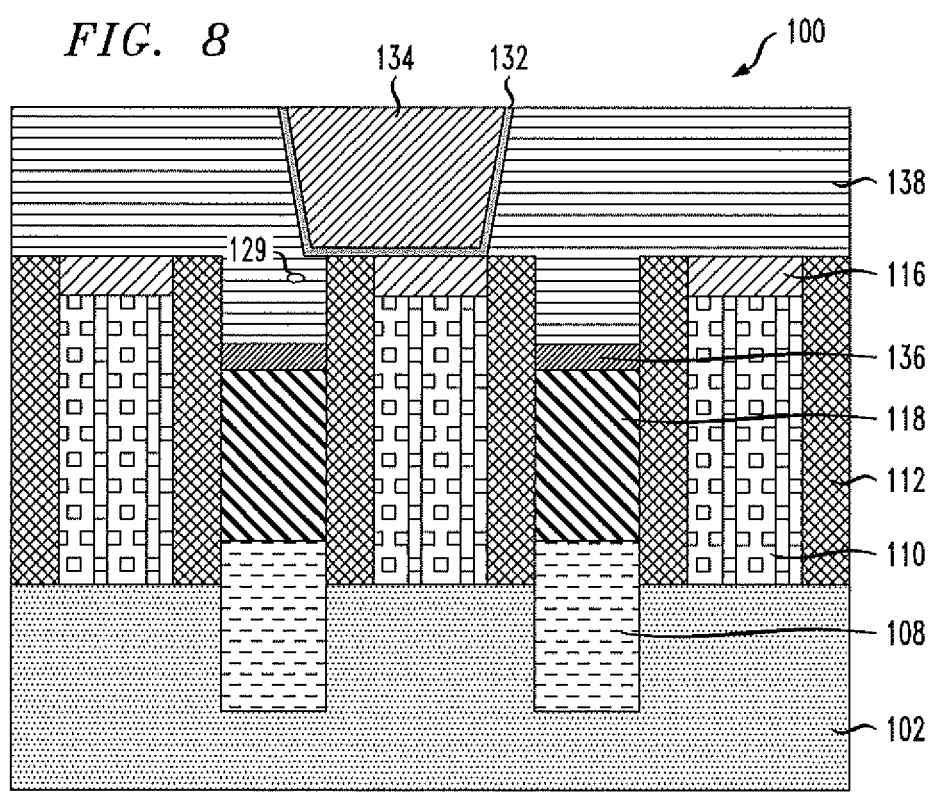
FIG. 8 is a cross sectional view of a semiconductor structure taken along the X2 axis of FIG. 1A at a second-intermediate fabrication stage, according to an alternative illustrative embodiment.

FIG. 8 illustrates a cross-sectional view of semiconductor structure 100 taken along the X2 axis of FIG. 1A at a second-intermediate fabrication stage. During this stage, OPL is first selectively removed using various etching processes such as, for example, a plasma ash etching process. OPL is also removed from the top surface of semiconductor structure 100 when looking at a cross-sectional view of semiconductor structure 100 taken along the X1 axis of FIG. 1A (not shown). The plasma ash etching process is selective to OPL 120 and not the gate spacers 112, gate cap layer 116, source/drain contact 118, liner layer 132 and capping layer 134. Alternatively, a dry etching process, for example, RIE may be used. Source/drain contact 118 is then recessed to below the top surface of gate spacers 112 by carrying out an isotropic etching technique such as an atomic layer etching that is selective to source/drain contact 118, and not the gate spacers 112, gate cap layer 116, liner layer 132 and capping layer 134.

Next, a metal 136 is selectively grown in the recessed portion of source/drain contact 118 and below the top surface of gate spacers 112. Metal 136 can be the same as those for metal 124 and is selectively grown as discussed above for metal 124. A dielectric layer 138 is then deposited on the top surface of metal 136 and over the semiconductor structure. Suitable oxides include any of those discussed above for dielectric layer 126 and is deposited as discussed above for dielectric layer 126. Semiconductor structure 100 taken along the X1 axis of FIG. 1A will have dielectric layer 138 disposed on its top surface (not shown). As can be seen, an airgap or seam 129 can be formed in dielectric layer 138.

Figure 9:
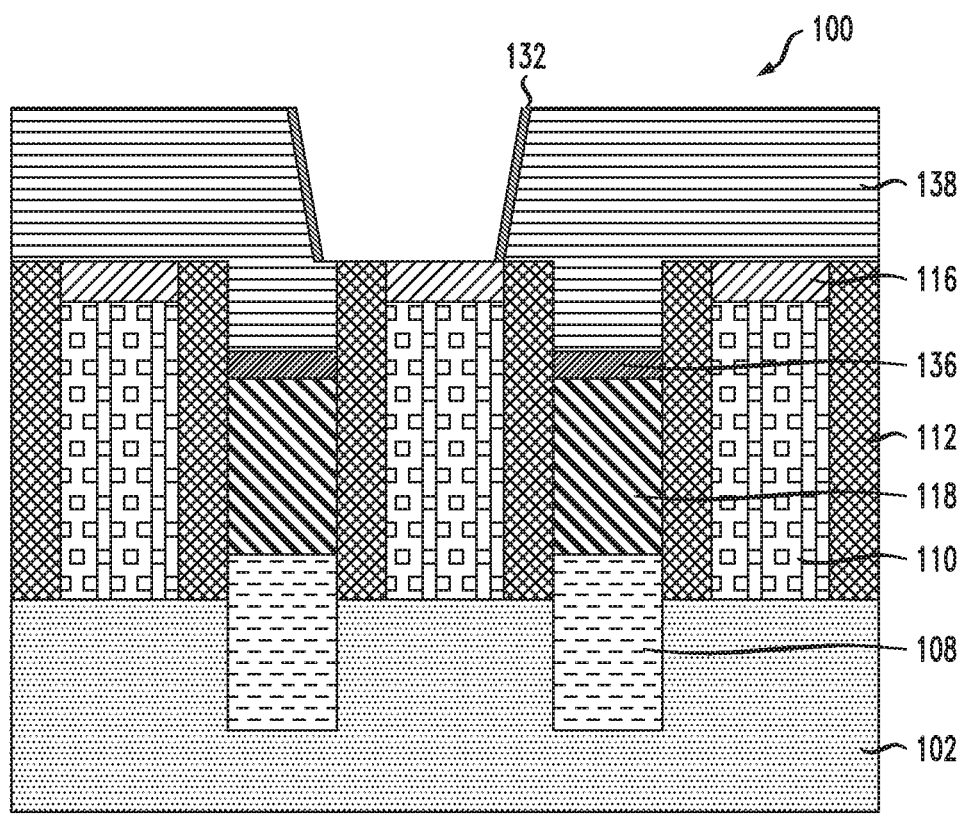
FIG. 9 is a cross sectional view of a semiconductor structure taken along the X2 axis of FIG. 1A at a third-intermediate fabrication stage, according to an alternative illustrative embodiment.

FIG. 9 illustrates a cross-sectional view of semiconductor structure 100 taken along the X2 axis of FIG. 1A at a third-intermediate fabrication stage. During this stage, capping layer 134 is first selectively removed using a dry etching process, for example, RIE, to create a via and expose the top surface liner layer 132. Next, liner layer 132 is removed to expose the top surfaces of gate spacers 112 and gate cap layer 116 and a portion of dielectric layer 138.

Figure 10A:
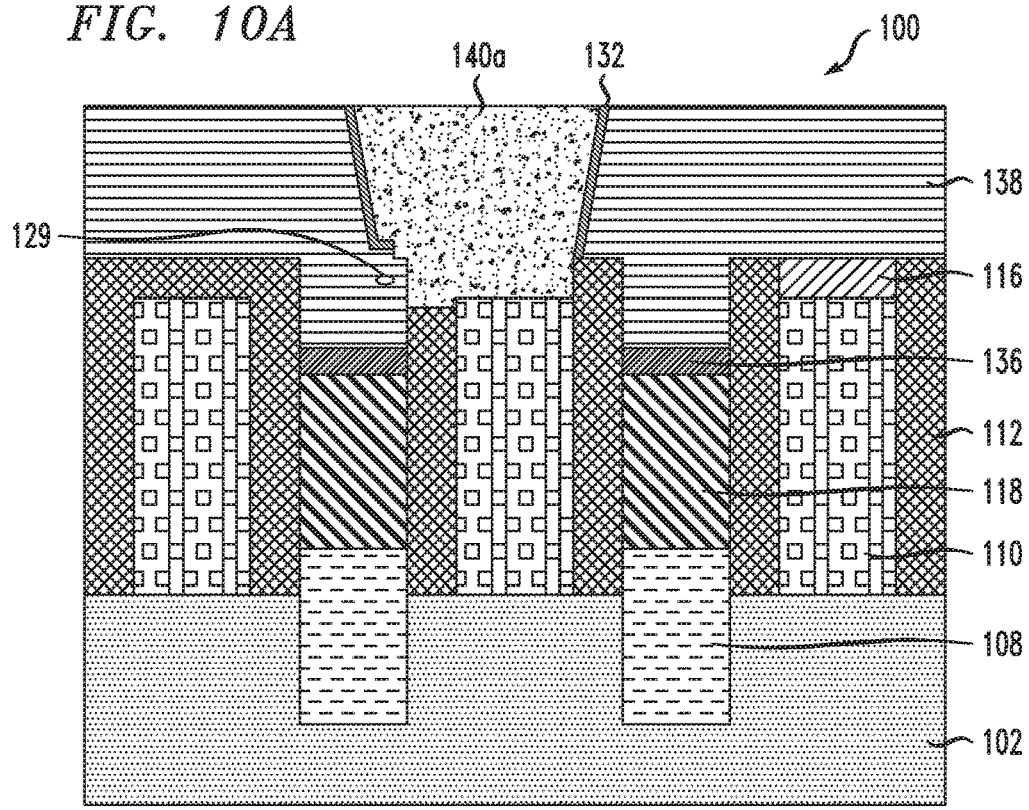
FIG. 10A is a cross sectional view of a resulting semiconductor structure taken along the X2 axis of FIG. 1A at a fourth-intermediate fabrication stage, according to an alternative illustrative embodiment.

FIG. 10A illustrates a cross-sectional view of semiconductor structure 100 taken along the X2 axis of FIG. 1A at a fourth-intermediate fabrication stage where gate cap layer 116 is selectively removed using various etching processes such as, for example, a plasma ash etching process, to form a via exposing the top surfaces of source/drain contact 118. In addition, a portion of gate spacer 112 is removed to below a top surface of source/drain contact 118 using, for example, atomic layer etching. Next, a conductive material is then deposited within the opening and forming gate contact 140a by a suitable deposition process, including, but not limited to, CVD, PECVD, PVD, plating, thermal or e-beam evaporation, sputtering, etc. The conductive material for forming gate contact 140a can be any of the material used to form gate contact 130a as discussed above. In one embodiment, the conductive material includes, for example, Al, W, Cu, Co. Ru, Mo, etc., with an optional suitable metal liner or other suitable types of conductive material.

Figure 10B:
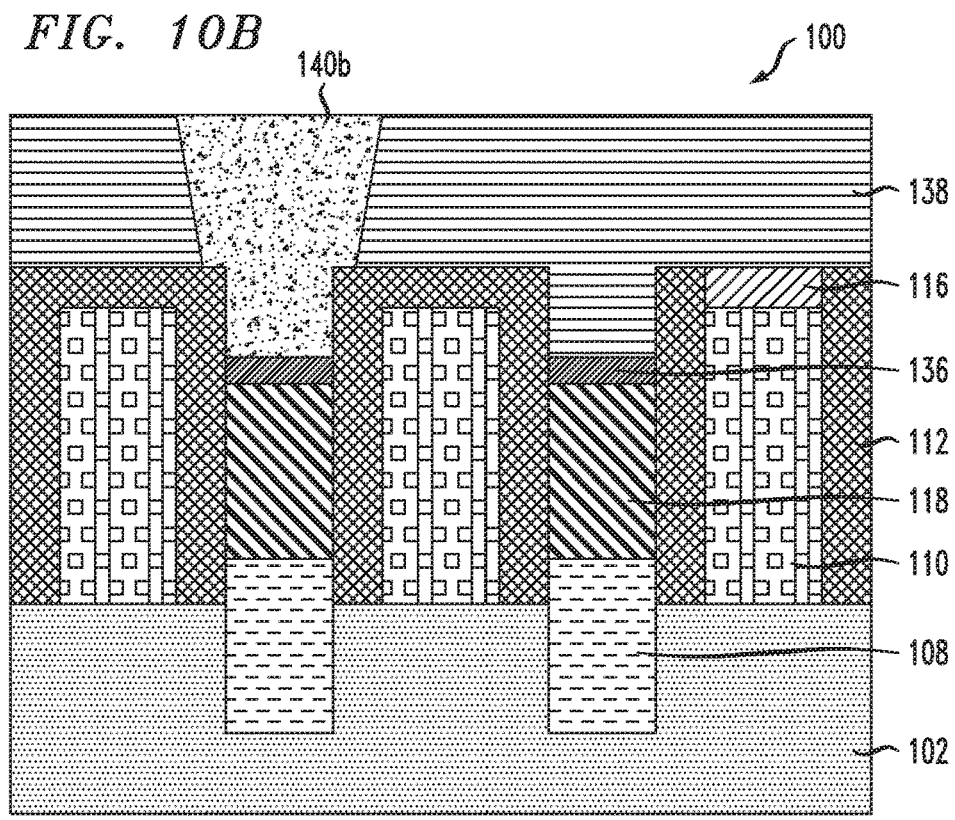
FIG. 10B is a cross sectional view of a resulting semiconductor structure taken along the X1 axis of FIG. 1A at the fourth-intermediate fabrication stage, according to an alternative illustrative embodiment.

FIG. 10B illustrates a cross-sectional view of semiconductor structure 100 taken along the X1 axis of FIG. 1A at the fourth-intermediate fabrication stage where a conductive material is then deposited within a via and forming source/drain contact 140b by a suitable deposition process, including, but not limited, CVD, PECVD, PVD, plating, thermal or e-beam evaporation, sputtering, etc. The conductive material for forming source/drain contacts 140b can be any of the conductive material discussed above. In one embodiment, the conductive material includes, for example, Al, W, Cu, Co Ru, Mo, etc., with optional metal liner or other suitable types of conductive material.

Figure 11:
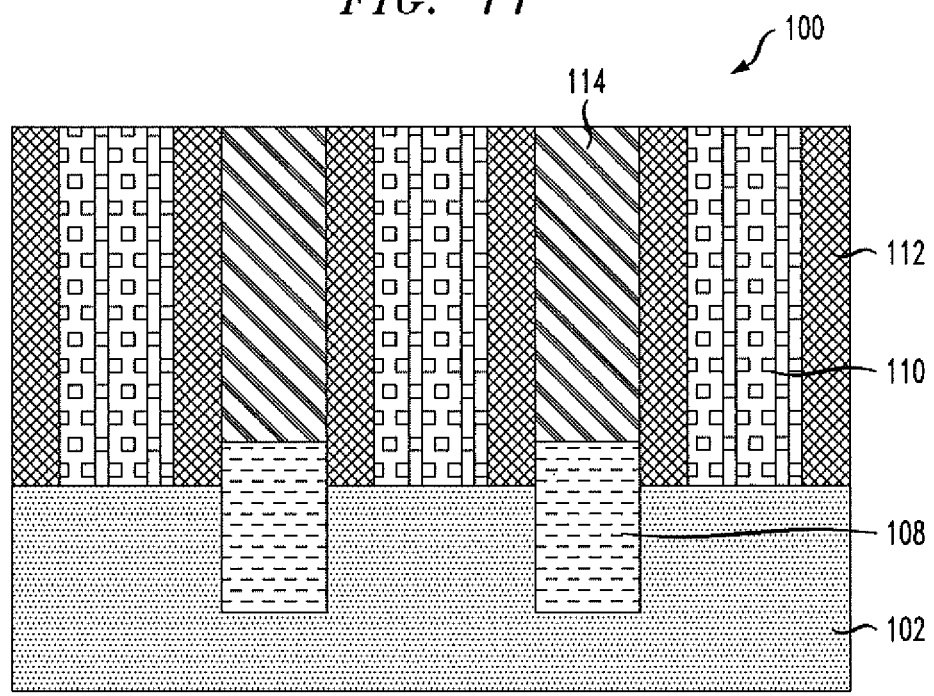
FIG. 11 is a cross sectional view of a semiconductor structure taken along the X2 axis of FIG. 1A at a first-intermediate fabrication stage, according to another alternative illustrative embodiment.

FIGS. 11-16B illustrate an alternate embodiment starting with the semiconductor structure 100. First, FIG. 11 illustrates a cross-sectional view of semiconductor structure 100 taken along the X2 axis as shown in FIG. 1A. As shown in FIG. 11 and as discussed above for FIG. 1B, semiconductor structure 100 is shown comprising semiconductor substrate 102. Semiconductor structure 100 further includes source/drain regions 108 between adjacent gate structures 110 and in contact with the substrate 102 (or counter-doped layer if formed), wherein a channel region is located under the gate structure. Semiconductor structure 100 further includes gate structures 110. Gate structures 110 further include gate spacers 112 on the sidewalls of the gate structure. Semiconductor structure 100 further includes ILD layer 114 deposited in the openings between gate spacers 112 and on the top surface bottom source/drain regions 108. The gate structures 110, gate spacers 112 and ILD layer 114 are planarized by, for example, a planarization process such as CMP.

Figure 12:
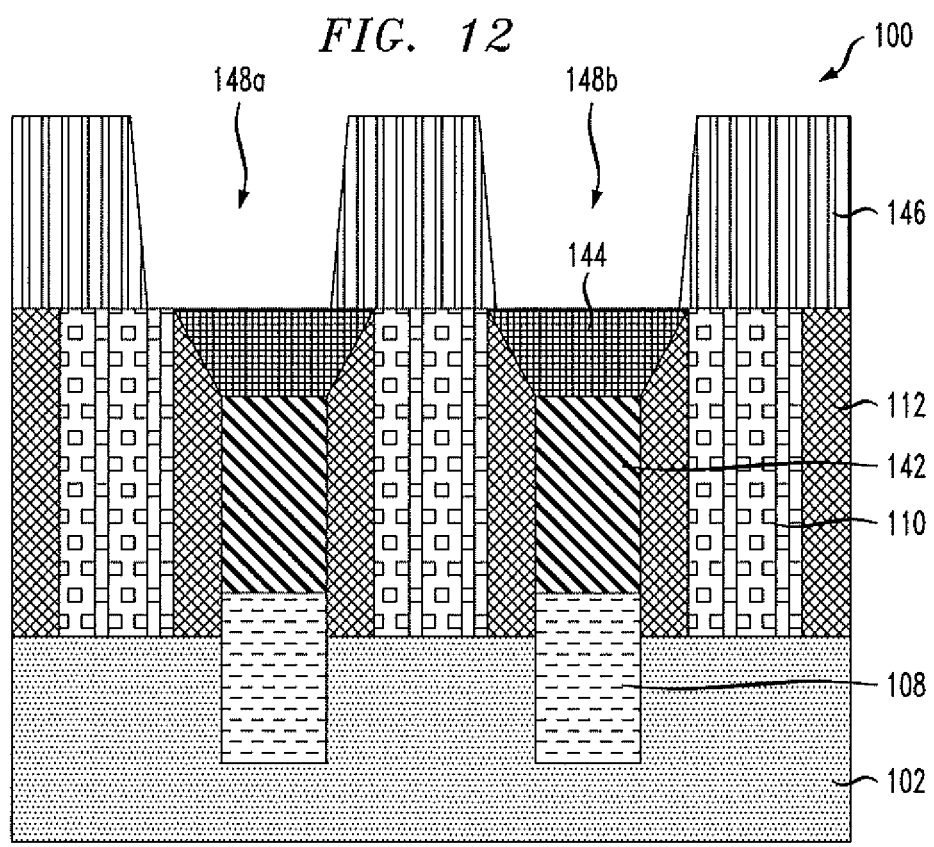
FIG. 12 is a cross sectional view of a semiconductor structure taken along the X1 axis of FIG. 1A at a second-intermediate fabrication stage, according to another alternative illustrative embodiment.

FIG. 12 illustrates a cross-sectional view of semiconductor structure 100 taken along the X1 axis of FIG. 1A at a second-intermediate fabrication stage of the alternative embodiment. During this stage, trenches are formed exposing the top surface of source/drain region 108 by techniques known in the art. For example, an OPL can first be deposited on the top surface of semiconductor structure 100 (not shown). Next OPL can be patterned and then etched by, for example, ME, to form the trenches. During the trench etching process, a portion of the gate spacers 112 is recessed to below the top surface of gate structures 110 such that the upper portion of gate spacers 112 will have a tapered shape. In other words, the trenches will have a tapered shape in the upper portion extending to the top of the gate spacers 112.

Next, a conductive material is then deposited in the trenches to form source/drain contact 142. Suitable conductive material can be any of those discussed above with respect to source/drain contact 118. The conductive material can be deposited using a suitable deposition process, for example, CVD, PECVD, PVD, plating, thermal or e-beam evaporation, sputtering, etc. Source/drain contact 142 is then recessed to the bottom portion of the tapered shape of gate spacer 112 using, for example, a dry etching such as RIE. Next, capping layer 144 is deposited in the recessed portion of source/drain contact 142 and then planarized by, for example, CMP. The capping layer 144 comprises, for example, a nitride material such as SiN or other materials such as SiC, SiCO, SiO2, etc. The capping layer 144 can be deposited using a suitable deposition process, for example, CVD, PECVD, PVD, plating, thermal or e-beam evaporation, sputtering, etc.

Next, OPL 146 is deposited on the top surface of semiconductor structure 100 using traditional techniques for forming such materials, e.g., spin-coating, deposition, etc. Next, source/drain contact vias 148a and 148b are formed in the OPL 146 after selectively etching the OPL 146 by techniques known in the art and exposing at least a portion of capping layer 144 in source/drain contact vias 148a and 148b. As can be seen, source/drain contact via 148a is misaligned whereas source/drain contact via 148b is well aligned. Source/drain contact vias 148a and 148b are formed using an etch process and etch environment which is suitable to etch the OPL 146 selective to the capping layer 144. OPL 146 is also deposited on the top surface of semiconductor structure 100 and planarized when looking at a cross-sectional view of semiconductor structure 100 taken along the X2 axis of FIG. 1A (not shown).

Figure 13:
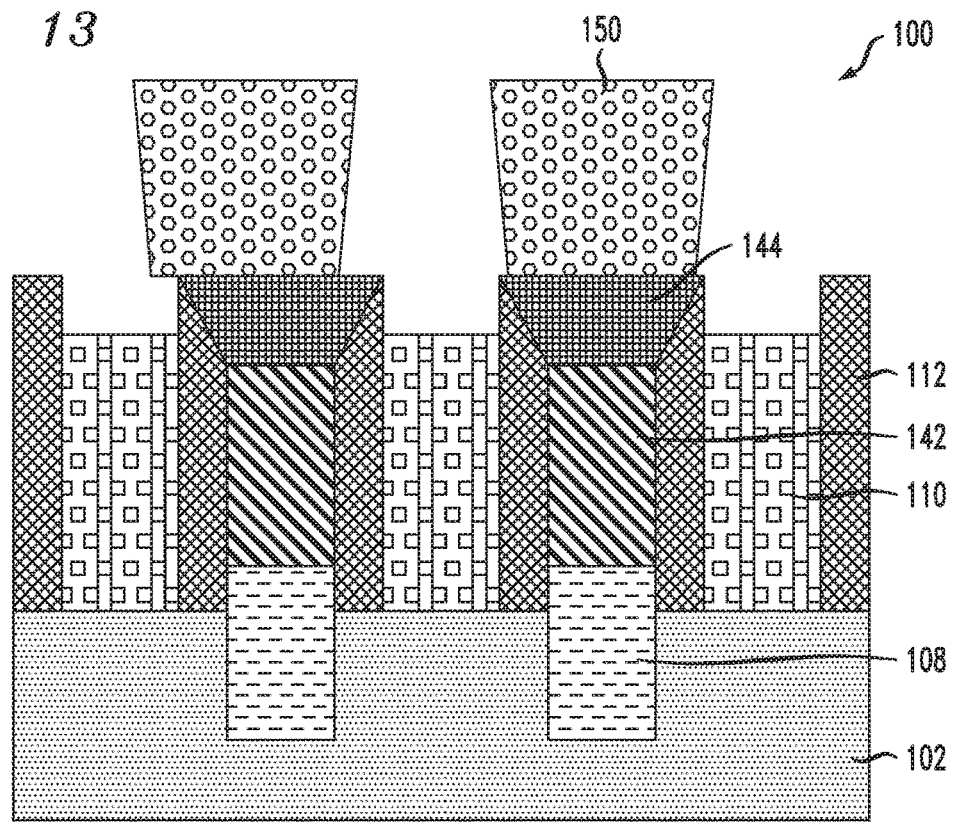
FIG. 13 is a cross sectional view of a semiconductor structure taken along the X1 axis of FIG. 1A at a third-intermediate fabrication stage, according to another alternative illustrative embodiment.

FIG. 13 illustrates a cross-sectional view of semiconductor structure 100 taken along the X1 axis of FIG. 1A at a third-intermediate fabrication stage of the alternative embodiment. During this stage, sacrificial place-holder material 150 is deposited in and fills source/drain contact vias 148a and 148b. Sacrificial place-holder material 150 can be deposited using a suitable deposition process, for example, CVD, PECVD, PVD, plating, thermal or e-beam evaporation, sputtering, etc. Suitable material for sacrificial place-holder material 150 includes, for example, SiN. As one skilled in the art will understand, capping layer 144 and sacrificial place-holder material 150 should have a similar etch property. After depositing the sacrificial place-holder material 150, an etching back process can be performed to remove any overburden sacrificial place-holder material and expose the top surface of the OPL 146 (not shown).

Next, OPL 146 is first selectively removed using various etching processes such as, for example, a plasma ash etching process. OPL 146 is also removed from the top surface of semiconductor structure 100 when looking at a cross-sectional view of semiconductor structure 100 taken along the X2 axis of FIG. 1A (not shown). The plasma ash etching process is selective to OPL 146 and not the gate structures 110, gate spacers 112, capping layer 144 and sacrificial place-holder material 150. Alternatively, a dry etching process, for example, RIE may be used. Gate structures 110 are then recessed to a portion below gate spacers 112 such that there is no contact with sacrificial place-holder material 150.

Figure 14:
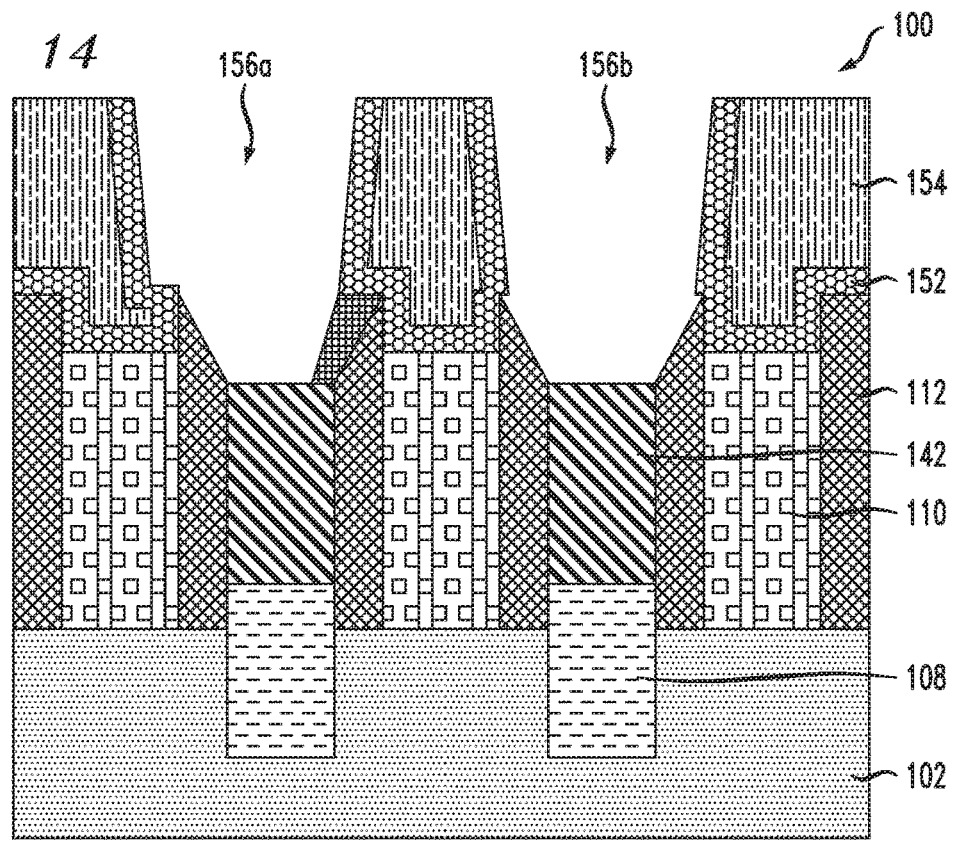
FIG. 14 is a cross sectional view of a semiconductor structure taken along the X1 axis of FIG. 1A at a fourth-intermediate fabrication stage, according to an illustrative embodiment.

FIG. 14 illustrates a cross-sectional view of semiconductor structure 100 taken along the X1 axis of FIG. 1A at a fourth-intermediate fabrication stage. During this stage, a liner layer 152 of suitable lining material is deposited on the exposed recessed surfaces of the gate structure 110, gate spacer 112, capping layer 144 and sacrificial place-holder material 150. The lining material may be any suitable lining material, for example, SiO$_2$, or a nitride based material such as SiN, although other material may be used as well. The lining material may be deposited by any conventional deposition technique such as CVD, a sputter deposition process, or any other technique. Semiconductor structure 100 taken along the X2 axis of FIG. 1A will have liner layer 152 disposed on the planarized top surface of the gate structure 110, gate spacer 112, and capping layer 144 (not shown).

Next, ILD layer 154 is deposited on the top surface of liner layer 152 of semiconductor structure 100 and planarized. ILD layer 154 can be of the same or different material as described above for ILD layer 114. The ILD layer 154 material is deposited by a suitable deposition process, including, but not limited to, CVD, PVD, PECVD, ALD, evaporation, chemical solution deposition, or like processes. The top surface of semiconductor structure 100 can then be planarized by, for example, CMP. Following planarization, sacrificial place-holder material 150 is selectively removed using a dry etching process, for example, RIE, to create source/drain contact vias 156a and 156b. As can be seen, source/drain contact via 156a is misaligned whereas source/drain contact via 156b is well aligned. Semiconductor structure 100 taken along the X2 axis of FIG. 1A will have ILD layer 154 disposed on liner layer 152 and planarized (not shown).

Figure 15:
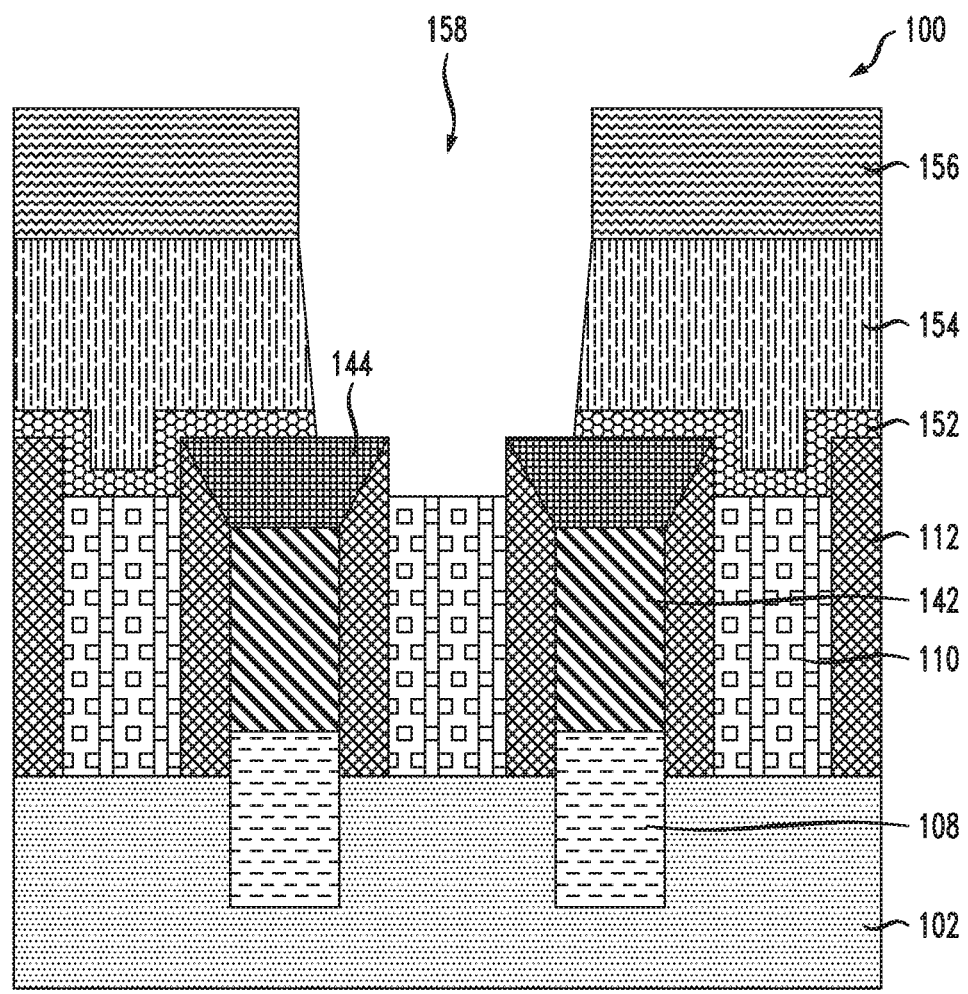
FIG. 15 is a cross sectional view of a semiconductor structure taken along the X2 axis of FIG. 1A at a fifth-intermediate fabrication stage, according to another alternative illustrative embodiment.

FIG. 15 illustrates a cross-sectional view of semiconductor structure 100 taken along the X2 axis of FIG. 1A at a fifth-intermediate fabrication stage. During this stage, OPL 156 is deposited on the top surface of ILD 154 using traditional techniques for forming such materials, e.g., spin-coating, deposition, etc. Next, a gate contact via 158 is created to expose the top surface of liner layer 152 using a selective etching technique such as RIE which is selective to the ILD 154 and OPL 156 and not the liner layer 152 (not shown). Next, liner layer 152 is selectively removed using, for example, ME, to expose a top surface of gate structure 110 and a portion of capping layer 144. Semiconductor structure 100 taken along the X1 axis of FIG. 1A will have OPL 156 disposed in source/drain contact vias 156a and 156b and on the top surface of semiconductor structure 100 (not shown).

Figure 16A:
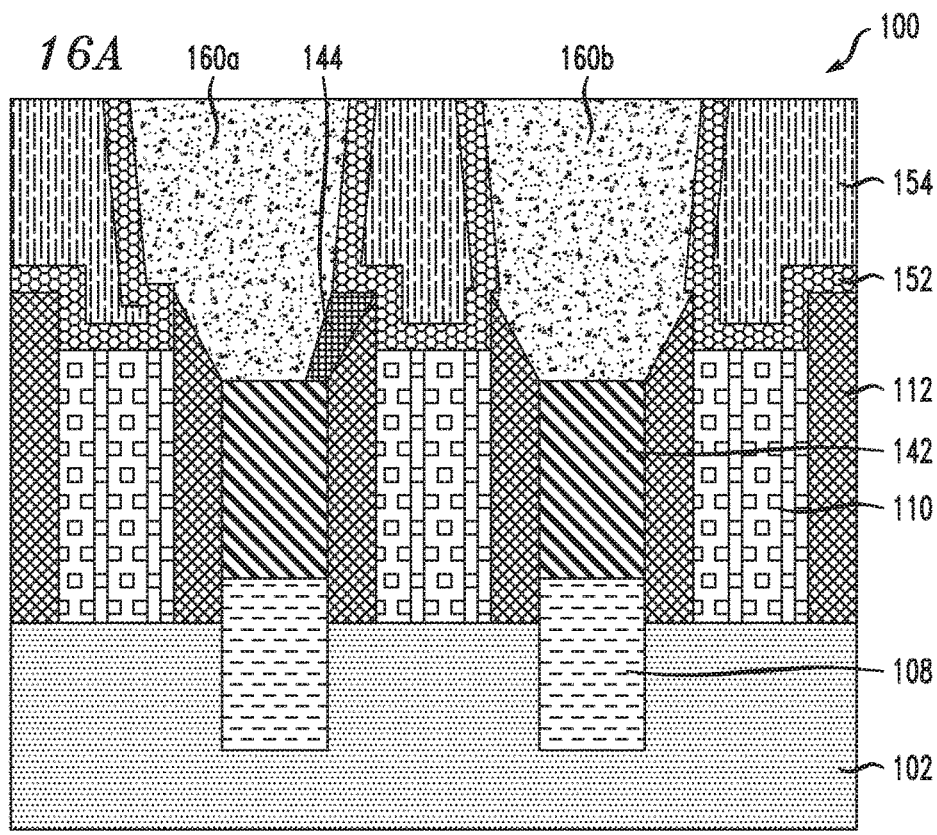
FIG. 16A is a cross sectional view of a resulting semiconductor structure taken along the X1 axis of FIG. 1A at a sixth-intermediate fabrication stage, according to another alternative illustrative embodiment.

FIG. 16A illustrates a cross-sectional view of semiconductor structure 100 taken along the X1 axis of FIG. 1A at the sixth-intermediate fabrication stage where OPL 156 is selectively removed using various etching processes such as, for example, a plasma ash etching process, to form a via exposing the top surface of source/drain contact 118. The plasma ash etching process is selective to OPL 156 and not the source/drain contact 118. Alternatively, a dry etching process, for example, RIE may be used. Next, a conductive material is deposited within the via and forming source/drain contacts 160a and 160b by a suitable deposition process, including, but not limited, CVD, PECVD, PVD, plating, thermal or e-beam evaporation, sputtering, etc. The conductive material for forming source/drain contacts 160a and 160b can be any of the conductive material discussed above. In one embodiment, the conductive material includes, for example, Al, W, Cu, Co Ru, Mo, etc., with optional metal liner or other suitable types of conductive material.

Figure 16B:
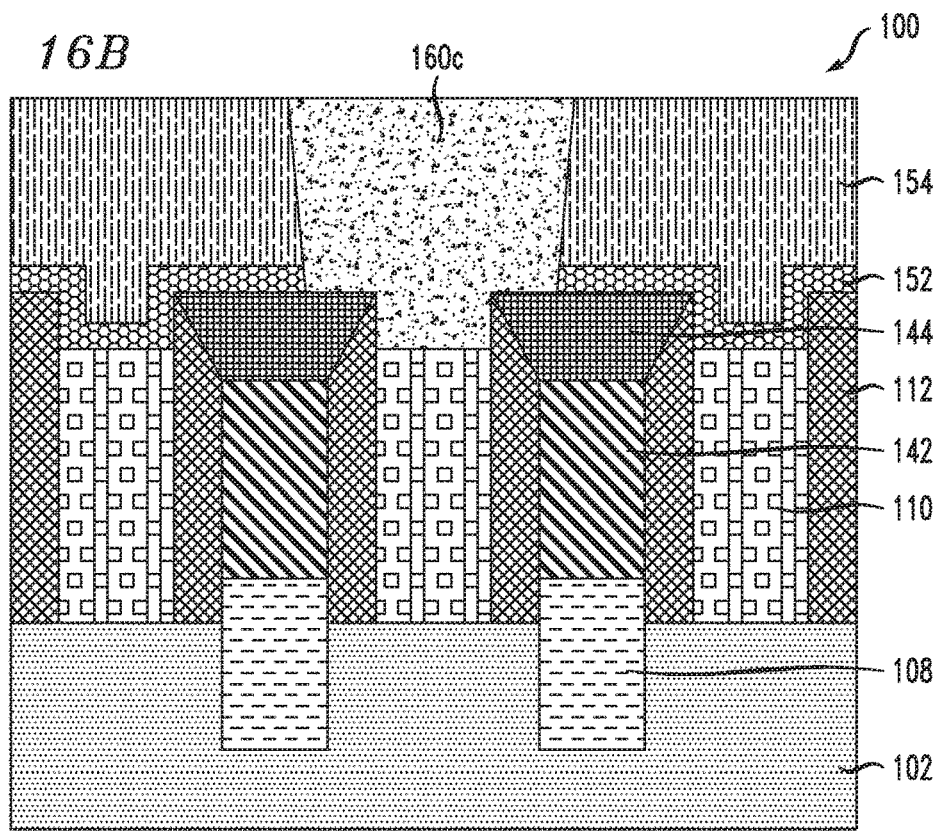
FIG. 16B is a cross sectional view of a resulting semiconductor structure taken along the X2 axis of FIG. 1A at the sixth-intermediate fabrication stage, according to an illustrative embodiment.

FIG. 16B illustrates a cross-sectional view of semiconductor structure 100 at a sixth-intermediate fabrication stage where a conductive material is deposited within the opening and forming gate contact 160c by a suitable deposition process including, but not limited, CVD, PECVD, PVD, plating, thermal or e-beam evaporation, sputtering, etc. The conductive material for forming gate contact 160c can be any of the conductive material discussed above. In one embodiment, the conductive material includes, for example, Al, W, Cu, Co. Ru, Mo, etc., with an optional suitable metal liner or other suitable types of conductive material.

It is to be further understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method of forming a semiconductor device comprising:
   forming a semiconductor structure comprising a semiconductor substrate having two or more fins, a plurality of recessed gate structures disposed on at least a portion of each of the fins, a gate cap layer disposed on a top surface of the recessed gate structures, gate spacers disposed on sidewalls of the recessed gate structures and the gate cap layer, a source/drain region in a recessed region of the semiconductor substrate between each adjacent gate spacer, a first conductive material disposed on a top surface of each of the source/drain regions, and a first optical planarization layer disposed over a top surface of the semiconductor structure;
   etching the first optical planarization layer on one of the fins and exposing a top surface of each of the gate spacers, the gate cap layer and a portion of the first conductive material adjacent to the exposed gate spacers to form a first gate contact opening;
   depositing a sacrificial place-holder material in the first gate contact opening;
   removing the first optical planarization layer; and
   recessing the first conductive material.

2. The method of claim 1, further comprising:
   selectively growing a metal layer on the recessed first conductive material to below a top surface of the gate spacers; and
   depositing a dielectric layer on a top surface of the metal layer, gate spacers and gate cap layer, wherein the dielectric layer is coplanar with the sacrificial place-holder material.

3. The method of claim 2, further comprising:
   removing the sacrificial place-holder material to form an opening; and
   depositing a second optical planarization layer in the opening.

4. The method of claim 3, further comprising:
   removing the second optical planarization layer to form a second gate contact opening; and
   depositing a second conductive material in the second gate contact opening.

5. The method of claim 1, wherein the gate cap layer and the sacrificial place-holder material are the same and comprise SiC or SiCO.

6. The method of claim 2, wherein the metal layer and the first conductive material are different metals.

7. The method of claim 6, wherein the metal layer comprises tungsten and the first conductive material comprises cobalt.

8. The method of claim 4, wherein the first conductive material and the second conductive material are the same or different and comprise a metal selected from the group consisting of copper, cobalt, aluminum, lead and tungsten.

9. A method of forming a semiconductor device comprising:
   forming a semiconductor structure comprising a semiconductor substrate having two or more fins, a plurality of recessed gate structures disposed on at least a portion of each of the fins, a gate cap layer disposed on a top surface of the recessed gate structures, gate spacers disposed on sidewalls of each of the recessed gate structures and the gate cap layer, a source/drain region in a recessed region of the semiconductor substrate between each adjacent gate spacer, a first conductive material disposed on a top surface of each of the source/drain regions, and a first optical planarization layer over a top surface of the semiconductor structure;
   etching the first optical planarization layer on one of the fins and exposing a top surface of each of the gate spacers, the gate cap layer and a portion of the first conductive material adjacent to the exposed gate spacers to form a first gate contact opening;
   depositing a liner layer in the first gate contact opening;
   depositing a sacrificial place-holder material on the liner layer and filling the first gate contact opening;
   removing the first optical planarization layer; and
   recessing the first conductive material.

10. The method of claim 9, further comprising:
    selectively growing a metal layer on the recessed first conductive material to below a top surface of the gate spacers; and
    depositing a dielectric layer on a top surface of the metal layer, gate spacers and gate cap layer, wherein the dielectric layer is coplanar with the liner layer and the sacrificial place-holder material.

11. The method of claim 10, further comprising:
    removing the sacrificial place-holder material to form an opening;

removing the liner layer from a bottom surface of the opening exposing recessed the gate structures and the gate spacers;

removing a portion of the gate spacers to below a top surface of the recessed gate structures; and depositing a second conductive material in the opening to form a gate contact.

12. The method of claim 11, wherein the portion of the gate spacers is removed by atomic layer etching.

13. The method of claim 11, wherein about 10 nanometers of the gate spacers is removed.

14. The method of claim 9, wherein the liner layer comprises $SiO_2$ and the sacrificial place-holder material comprises SiN.

15. The method of claim 10, wherein the metal layer and the first conductive material are different metals.

16. The method of claim 15, wherein the metal layer comprises tungsten and the first conductive material comprises cobalt.

17. The method of claim 11, wherein the first conductive material and the second conductive material are the same or different and comprise a metal selected from the group consisting of copper, cobalt, aluminum, lead and tungsten.

18. The method of claim 10, wherein the first gate contact opening is not aligned with the recessed gate structures.

19. A method comprising:

forming a semiconductor structure comprising a semiconductor substrate having two or more fins, a plurality of recessed gate structures disposed on at least a portion of each of the fins, a gate cap layer disposed on a top surface of each of the gate structures, gate spacers disposed on sidewalls of each of the gate structures and the gate cap layers, a source/drain region in a recessed region of the semiconductor substrate between each adjacent gate spacer, a first interlevel dielectric layer disposed on a top surface of each of the source/drain regions, and a first optical planarization layer disposed over a top surface of the semiconductor structure;

selectively etching the first optical planarization layer on one of the fins and removing the first interlevel dielectric layer and a portion of each of the gate spacers to form a first opening, wherein an upper portion of the gate spacers has a tapered shape;

removing the first optical planarization layer;

depositing a first conductive material in the first opening;

recessing the first conductive material to a bottom portion of the tapered shape of the gate spacer to form a second opening;

depositing a cap layer in the second opening;

depositing a second optical planarization layer on the top surface of the semiconductor structure;

forming an opening in the second optical planarization layer exposing at least a top surface of the cap layer;

depositing a sacrificial place-holder material in the opening;

removing the second optical planarization layer; and recessing the gate structures.

20. The method of claim 19, further comprising:

depositing a liner layer on the recessed gate structures;

depositing a second interlevel dielectric layer on the liner layer;

depositing a third optical planarization layer on the second interlevel dielectric layer;

selectively removing a portion of the liner layer, second interlevel dielectric layer and third optical planarization layer to form a trench exposing a top surface of the recessed gate structures; and depositing a second conductive material in the trench.

* * * * *